United States Patent
Saguchi et al.

[19]

[11] Patent Number: 6,110,240
[45] Date of Patent: Aug. 29, 2000

[54] SUPERHARD ARTICLE WITH DIAMOND COAT AND METHOD OF MANUFACTURING SAME

[75] Inventors: Hiromi Saguchi; Takashi Okamura, both of Aichi; Satoshi Iio, Gifu, all of Japan

[73] Assignee: NGK Spark Plug Co., Ltd., Japan

[21] Appl. No.: 08/977,972

[22] Filed: Nov. 25, 1997

[30] Foreign Application Priority Data

| May 31, 1996 | [JP] | Japan | 8-160813 |
| Mar. 13, 1997 | [JP] | Japan | 9-079042 |
| May 30, 1997 | [JP] | Japan | 9-157642 |

[51] Int. Cl.$^7$ ............... B24D 3/02; C23C 16/26
[52] U.S. Cl. ............ 51/307; 427/249.8; 427/309; 427/560; 205/674; 407/119
[58] Field of Search ............ 427/249, 309, 427/560, 249.8; 205/674; 204/129.1; 51/307; 407/119

[56] References Cited

U.S. PATENT DOCUMENTS

| 4,925,538 | 5/1990 | Matsumoto et al. | 204/129.1 |
| 5,014,588 | 5/1991 | Omata et al. | |
| 5,164,051 | 11/1992 | Komaki et al. | |
| 5,227,034 | 7/1993 | Stein et al. | 204/129.1 |
| 5,567,526 | 10/1996 | Peters et al. | |
| 5,700,518 | 12/1997 | Lee et al. | 427/249 |

FOREIGN PATENT DOCUMENTS

| 0 445 305 | 11/1991 | European Pat. Off. |
| 58-126972 | 7/1983 | Japan |
| 60-204695 | 10/1985 | Japan |
| 61-270372 | 11/1986 | Japan |
| 62-226889 | 10/1987 | Japan |
| 1-145396 | 6/1989 | Japan |
| 3-146663 | 6/1989 | Japan |
| 1-246361 | 10/1989 | Japan |
| 2-217398 | 8/1990 | Japan |
| 3-107460 | 5/1991 | Japan |
| 3-183774 | 8/1991 | Japan |
| 4-221075 | 8/1992 | Japan |
| 5-179450 | 7/1993 | Japan |
| 5-311442 | 11/1993 | Japan |
| 6-191993 | 7/1994 | Japan |
| 9-20590 | 1/1997 | Japan |
| 62-67174 | 2/1997 | Japan |
| 63-14869 | 2/1998 | Japan |

*Primary Examiner*—Roy V. King
*Attorney, Agent, or Firm*—Morrison & Foerster

[57] ABSTRACT

The present invention provides a method of manufacturing a superhard article with diamond coat having an excellent resistance against breakaway or peeling off of its coat, in particular, a cutting tool. A carbide base material formed to a desired shape containing tungsten carbide (WC) as a main component is soaked in a solution of alkali chloride and undergoes electrolytic etching on the surface of the base material at a maximum removal speed of 0.2 to 1.5 $\mu$m/min for 3 to 30 minutes and, after the surface of the base material is washed, a diamond coat is developed on the surface of the base material by vapor deposition.

20 Claims, 2 Drawing Sheets

SUPERHARD ARTICLE WITH DIAMOND COAT AND METHOD OF MANUFACTURING SAME

FIELD OF THE INVENTION

The present invention relates to a superhard article with a diamond coat of excellent resistance against breakaway or peeling off of the coat, in particular, to a method of manufacturing a cutting tool with a diamond coat.

BACKGROUND

There has been a problem that, when a diamond coat (or film) is applied to a carbide base material by gas phase synthesis, (termed hereinafter as "vapor deposition technique"), the diamond coat is easy to peel off due to differences in hardness, thermal expansion coefficient and crystal structure between the carbide base material and diamond coat and further to insufficient strength in adhesion of the diamond coat to the base material. Therefore, various proposals have been made to improve the adhesion strength of diamond coats. However, a satisfactory adhesion strength of the diamond coat to the base material for use in cutting tools to which great mechanical impact or thermal stress is applied has not been achieved so far, and there are cases where the diamond coating is not applicable to a tool such a drill as having a complicated shape.

Main proposals to improve the adhesion strength of the diamond coat include methods to obtain a mechanical engagement by having bumps and dips formed on the surface of a base material, to have an intermediate layer developed having a small coefficient of thermal expansion relative to that of diamond, to provide machining distortion with the aim of giving residual stress to the surface of the base material or to perform shot peening or ion implantation.

As a means to have bumps and dips formed on the surface of base materials, for example, a method of chemical etching using acids and alkali has been disclosed in JP Patent Kokai JP-A-62-67174/1987 or JP-A-5-179450/1993, a method of growing crystal grains or providing bumps and dips by allowing a surface reformed layer by heat treatment to develop in JP-A-01-246361/1989 or JP-A-6-191993/1994, a method of grinding machining in JP-A-63-14869/1988, a method of machining base materials by a laser in JP-A-5-311442/1993, a method of etching using ion or plasma in JP-A-60-204695/1985 or JP-1-145396/1989, a method of electrolytic etching in JP-A-3-146663/1991, JP-A-3-107460/1991, JP-A-3-183774/1991, JP-A-4-221075/1992 and JP-A-2-217398-1990, a method of soaking base materials in a solvent in which abrasive grains of diamond are dispersed and simultaneously performing ultrasonic washing and flawing treatment in JP-A-62-226889/1987, respectively.

Also, a method of providing machining strain has been disclosed in JP-A-61-270372/1986, however, in this method, an adhesion effect is reduced due to relation of residual stress caused by an increase in a temperature at the time of diamond synthesis and, in addition, the adhesive strength of diamond coat fluctuates widely because of poor reproducibility of the machining strain.

As a means to have an intermediate layer developed, a method of having an intermediate layer formed of carbide or nitride of IV, V, VI group metals grown on the surface of base material has been disclosed in JP Patent Kokai JP-A-58-126972/1983, however, in this method, the improvement of adhesive strength has not been achieved up to a practicable level because chemical bonding between diamond and the intermediate layer is hard to occur.

SUMMARY OF THE DISCLOSURE

In the course toward the present invention, the following further problems have been encountered and analyzed.

On the other hand, in the method of obtaining a mechanical engagement by having bumps and dips (generally termed as surface irregularities or roughness) formed on the surface of base materials, if cutting and machining would be performed to such a degree that satisfactory adhesive strength is obtained, a carbide cutting edge easily chips, as a result, significantly reducing cutting performance of a cutting tool product. Though the method of chemically etching on the surface of base materials allows bumps and dips to be formed in a state that sharpness of a cutting edge is kept retained, however, as the degree of its projection and depression is small, it is difficult to increase the adhesive strength of the diamond coat.

The method of growing crystal grains on the surface of base material developed by heat treatment can provide bumps and dips on the surface of base material to such a degree that they can comparatively increase adhesive strength of a diamond coat, and sharpness of an edge of a cutting tool as well. However, in this method, because thermal deformation appears in superhard articles which decreases the precision in terms of shape significantly, materials prepared according to this method cannot be used for manufacturing of cutting tools having a complicated shape such as a byte, drill and reamer to be applied to precision machining and therefore the range of application is limited accordingly. The methods of performing ion or plasma etching or laser processing on the surface of materials require expensive equipment and provide low productivity and lack cost performance.

The method of performing electrolytic etching on the surface of base materials is effective in forming bumps and dips on the surface which serves to provide high adhesive strength of diamond coat and can also form comparatively uniform bumps and dips regardless of the shape of base materials, and especially when hydrochloric acid is used as an electrolytic solution in the method, it forms better bumps and dips which can provide high adhesion strength. However, if the material is used for a cutting tool with a diamond coat such as a milling cutter receiving great mechanical impact thereon, its adhesive strength is insufficient, raising a problem that the coat is apt to be peeled off. Moreover, because the electrolytic solution is an acid, a great amount of Co (cobalt) is eluted during the treatment of electrolytic etching, mechanical strength of the material itself is reduced, posing a risk of chipping. Also, hydrochloric acid used as an electrolytic solution is difficult to be treated and an eluted metal ion such as $Co^{2+}$ is dissolved in waste liquid of the electrolytic solution left after electrolytic etching. Because, in the treatment of waste liquid for disposal, removal of metal ions is required, the waste liquid must be treated with alkali first and be filtered to separate cobalt hydroxide as precipitates and then must be again neutralized with acids, and these procedures are troublesome.

In the case of electrolytic etching using an alkaline solution as an electrolytic solution, because a removal speed of carbide or metal contained in carbide base materials is lower than that in the case of using an acid solution, the degree of formed bumps and dips is so small, causing a low adhesive strength of the diamond coat, and the resulting material is not practicable accordingly. Furthermore, the electrolytic etching method using chromic acid or phosphoric acid solution as an electrolytic solution does not provide a sufficiently high adhesive strength and also it raises problems in handling ease of the electrolytic solution and in treatment of waste liquid.

Therefore, it is an object of the present invention to solve the problem that a diamond coat is easily peeled off from base materials, and, particularly, to provide a method for manufacturing a superhard article with a diamond coat having high adhesive strength, which is simple, and which is free from limitation by the shape of base materials, allowing it to be applicable to a cutting tool having a complicated shape such as a drill, end mill, reamer, byte, etc.

Other objects and aspects will become apparent in the entire disclosusre.

According to a first aspect of the present invention, a method of manufacturing a superhard article with a diamond coat mainly comprising tungsten carbide (WC) is featured in that the base material formed to a required shape is soaked in a solution of alkali chloride and undergoes electrolytic etching on the surface of the superhard article at a maximum removal speed of 0.2 to 1.5 $\mu$m/min for 3 to 30 minutes and then after the surface of superhard articles ia washed, the diamond coat is applied to the surface of the superhard article by vapor deposition technique.

The inventors of the present invention investigated various methods for developing a diamond coat based on electrolytic etching which can provide bumps and dips on the surface of a base material which serve to make adhesive strength of the diamond coat comparatively high. As a result, it has been found that, by performing electrolytic etching using a solution of salt of chlorine ion and alkali metal, i.e., alkali chloride as electrolytic solution on carbide base materials at an adequate removal speed, good bumps and dips can be formed on the surface of base material without deteriorating the shape of the base material (i.e., without warping or strain of base material or dulling of cutting edge) and superhard articles with diamond coat with a high adhesive strength can be obtained and, because the solution of alkali chloride is neutral, the elution of Co during the processing of etching is limited only to a part of the surface of material and Co existing on the base materials which causes a decrease in the adhesive strength of diamond coat can be removed without reducing mechanical strength itself of the base material.

According to a further aspect of the present invention, a solution of alkali chloride is used as an electrolytic solution. Among the solutions of alkali chloride, a solution of potassium chloride or of sodium chloride in particular, which can serve to form great degree of bumps and dips and, as a result, increase in the adhesive strength of diamond coat, is preferably used.

Especially, a solution of potassium chloride is most preferably used as an electrolytic solution because it can increase most significantly adhesive strength of the diamond coat. Potassium and sodium chloride are less expensive and easy to get and, in addition, the treatment of waste liquid is simple, i.e., because the electrolytic solution using potassium or sodium chloride are neutral, during the electrolytic reaction, cobalt hydroxide is produced and then easily coprecipitated with other electrolytic products (for example $WO_3$ and the like). Thus, the treatment of waste liquid requires only filtration process for removal which simplifies treating procedures thereof. If electrolytic solution is acid, cobalt hydroxide will not be produced and if electrolytic solution is alkaline, other electrolytic products will not be produced and therefore coprecipitation will not occur, resulting in a need of pH adjustment of waste liquid which causes a complicated treatment.

According to the first aspect of the present invention, a superhard article with diamond coats having a high adhesive strength, high resistance against mechanical impacts by intermittent cutting and excellent machining precision, in particular, cutting tools such as a cutting insert, drill, etc. can be easily manufactured without the limitations by shapes of base materials (basic effect). According to further aspects, besides this basic effect, additional specific effects can be achieved as described in the Embodiments.

In the following the preferred embodiments will be described with reference to the drawings.

BRIEF DESCRIPTION OF THE DRAWINGS

FIG. 2(a) is a view of an end mill seen from its rotary axis direction and 2(b) is a view of the end mill seen from a direction normal to its rotary axis.

FIG. 3(a) is a view of a throwing away insert seen from the axis direction of its circular cylindrical shape through-hole and 3(b) is a view of the throwing away insert seen from a direction normal to its circular cylindrical shape through-hole.

PREFERRED EMBODIMENTS

In this application, not only highest/lowest values but also any intermediate values are involved within the value range. In the electrolytic etching on the surface of carbide base material, the carbide base material is connected to the anode side and the maximum removal speed is set to 0.2 to 1.5 $\mu$m/min and the time for the etching to 3 to 30 minutes. By limiting the maximum removal speed to 1.5 $\mu$m/min or less, bumps and dips that allow desirable adhesive strength of coat without blunting the edge of a carbide tool can be formed. If the etching speed is more than 1.5 $\mu$m/min., the etching is so severe that the edge of a carbide tool is blunted and the degree of formed bumps and dips is reduced resulting in a lower adhesive strength. The maximum etching speed of less than 0.2 $\mu$m/min causes a small degree of formed bumps and dips and a low adhesive strength of coat. The maximum removal speed in the etching is preferably 0.4 to 1.0 $\mu$m/min and the etching time is preferably 5 to 20 minutes in particular.

The maximum removal speed represents a moving speed of an etching front which progresses as through an easy-to-etch part of the base material being etched. When the electrolytic etching speed is changed in the middle of the processing, an average maximum etching speed is preferably set to 0.4 to 1.0 $\mu$m/min. Because the surface of base materials which has undergone electrolytic etching is contaminated with products produced by reactions of base material removed through the etching and/or alkali salts, the surface is washed prior to the formation of coat so that the adhesive strength of diamond coat can be stably obtained. The formation of diamond coats on the surface of base materials is performed by known gas phase synthesis method (termed vapor deposition technique) such as microwave plasma CVD, thermal filament method, and the like.

In a further aspect, the carbide base material to be used for manufacturing of base materials with diamond coats of the present invention contains tungsten carbide (WC) as a main component and 0.3 to 10%, preferably 0.5 to 10% in total by weight, calculated in carbide equivalent, of one or more compounds selected from carbide, nitrite and carbon nitride of Ti, Ta, Nb and V and 2 to 10% by weight of Co and/or Ni.

The base material used in the present invention is so called sintered carbide (termed "superhard alloy") containing WC as a main component and adhesive strength of its diamond coats is made excellent by containing a hard phase comprising one or more compounds (or solid solution containing W) selected from carbide, nitride and carbon nitride of Ti, Ta, Nb and V. That is, when bumps and dips are formed on the surface of the base material by electrolytic etching, because the removal speed of the hard phase containing carbide, nitride and carbon nitride of Ti, Ta, Nb and V is slower than that of a hard phase containing WC as a main component, bumps and dips having preferably effective configurations can be formed on the electrolytically etched surface of carbide base materials containing above compounds. If the base material contains less than 0.5% in total by weight, calculated in carbide equivalent, of carbide, nitride and carbon nitride of Ti, Ta, Nb and V, especially if it contains less than 0.3% by weight, there is almost no effect of the inclusion of these compounds. Even if it contains more than 15% by weight, further improvement of the adhesive strength is not expected.

A preferable average crystal grain size of a hard phase contained in carbide base materials mainly comprising carbide, nitride and carbon nitride of Ti, Ta, Nb and V has a bearing on the degree or size of the bumps and dips formed on the surface of the base material. In order to obtain a high adhesive strength of diamond coat, the average crystal grain size of these compounds is preferably 0.3 to 5 $\mu$m, more preferably 0.5 to 2 $\mu$m and most preferably 1 to 2 $\mu$m.

If the material contains a high proportion of Co and/or Ni, the adhesive strength of diamond coat becomes low and if it contains little, mechanical properties of the material, for example, strength becomes low, and therefore their contents are adjusted according to an application of the cutting tool. In order to use the material in a wide range of applications as a cutting tool, the contents of Co and/or Ni are preferably 2 to 10% in total by weight, more preferably 3 to 6% in total by weight.

In the preferred method of manufacturing superhard articles with diamond coat of the present invention, said best maximum removal speed can be obtained upon electrolytic etching, if the concentration of alkali chloride used as an electrolytic solution, is 0.5 to 20% in weight, and the current density of the surface of base material is 0.03 to 0.30 A/cm$^2$, preferably 0.10 to 0.30 A/cm$^2$. The concentration of the electrolytic solution and the current density of the surface of base material are more preferably 1 to 10% by weight and 0.06 to 0.25A/cm$^2$ (most preferably 0.15 to 0.25A/cm$^2$), respectively.

Because a solution of alkali chloride is used as an electrolytic solution, when the carbide base material contains Co, a precipitate of electrolytic products (coprecipitated substance of cobalt hydroxide and other electrolytic products [WO$_3$]etc.) is formed during the electrolytic etching treatment. Therefore, without a treatment of pH adjustment, heavy metals left in the electrolytic solution after the treatment of electrolytic etching can be collected by filtration of the coprecipitated substance. Moreover, as the waste liquid is neutral, the treatment of waste liquid is very easy as compared with such an etching method as uses acids or alkali.

In the method of the present invention wherein electrolytic etching is performed by using alkali chloride as an electrolytic solution (which is neutral), since the Co phase of the surface of base material elutes in the electrolytic solution during the etching process, before formation of the diamond coat, a treatment to remove Co from the surface of the base material is not required. Furthermore, the depth of a layer formed by the eluted Co is only about 1 to 2 $\mu$m and the elution is limited to only a superficial part of the surface of the base material, inducing no reduction in the strength of the base material itself.

On the other hand, in the case of electrolytic etching using a mineral acid as an electrolytic solution (which is acid), the depth of said Co-eluted layer is about 10 $\mu$m, causing reduction of the strength of the base material. In electrolytic etching using alkali as an electrolytic solution (which is alkaline), Co is not eluted from the base material, therefore raising no problem of reducing the strength of the base material, however, a new process of moderately removing Co eluted on the surface of the base material by using acids and the like following the electrolytic etching is required. That is, in case where diamond coat is developed on the surface of the carbide base material by vapor deposition technique, if there exists Co on the surface of the carbide base material, non-diamond substances (such as amorphous carbon) are apt to be produced on the surface of the base material as Co has a strong affinity to carbon. As a result, the adhesion strength of diamond coat to the base material is lowered and treatment of removing Co from the surface of the base material is required.

According to the present invention, in a preferable method of manufacturing base material with diamond coat, the diamond coat is developed by vapor deposition technique on the surface of the base material at a rate of 0.1 to 1.0 $\mu$m/hour during 15 to 50% of a period of time as an initial stage and at a rate of 1.0 to 2.0 $\mu$m/hour during the remaining period of time, respectively, in the entire process. That is, at the initial stage of the vapor deposition process, a diamond coat is developed on the surface of the base material at so low a speed that allows a high generation density of crystal nucleus and an easy development of coat in the fine bumps and dips formed on the surface of the base material, and then the coat is further developed by the vapor deposition process under the conditions for the development of a coat having high wear resistance, i.e., the conditions are changed consecutively or intermittently in multiple stages. The thickness of diamond coat developed on the base material is preferably 5 to 40 $\mu$m so that it can provide a good life as a cutting tool.

In a further preferred method of manufacturing base materials with diamond coat of the present invention, after completion of the electrolytic etching, the base material is soaked in a solvent in which diamond grains are dispersed and ultrasonic washing/cleaning is executed thereon. The ultrasonic treatment (such as ultrasonic washing) following the electrolytic etching can produce many fine flaws on the surface of the base material which become the crystal nucleus, as a result, improving the adhesion stremgth of coat to the base material.

In a still further preferred method of manufacturing a superhard article with diamond coat of the present invention, the carbide base material has a shape of a cutting tool or insert (or tip) and a radius of curvature R at its cutting edge (i.e., rounded profile line on the cross-section of the angle region) is 30 $\mu$m or less. A superhard article having a diamond coat free from peeling off is useful as a cutting tool or insert (tip) and, in order to obtain a cutting tool having a good cutting performance, the radius of curvature R at its cutting edge is preferably 30 $\mu$m or less. The radius of curvature R at the cutting edge is measured by observing a cross section normal to the edge profile using an electron microscope etc. The radius of curvature R at the cutting edge is most preferably 30 $\mu$m or less, more preferably 20 $\mu$m or less.

A yet further method of manufacturing superhard articles with diamond coat of the present invention is featured in that a diamond coat is developed by vapor deposition technique on the surface of the carbide base material treated by electrolytic etching in a solution of potassium chloride so that the surface roughness Ra of the carbide base material formed to a desired shape, which is measured in accordance with JIS 0601 (1994), is preferably 0.4 to 1.5 $\mu$m, more preferably 0.7 to 1.5 $\mu$m. The surface roughness of the base material having a high adhesive strength of diamond coat is to be measured in accordance with JIS B0601 (1994) using a diamond stylus with a radius at the measuring apex of 5 $\mu$m. This surface roughness is preferably 0.4 to 1.2 $\mu$m, more preferably 0.8 to 1.2 $\mu$m. In addition, the term "surface roughness" used in this specification is equivalent to the "surface roughness Ra" defined in JIS B0601 (1994).

EXAMPLES

The embodiments of the present invention will be described in detail more fully hereinafter, however, the present invention should not be construed as limited to only the examples set forth herein.

Example 1 and Comparative Example 1
Samples 1–4 (Examples of the present invention)

Powder of WC with an average grain diameter of 2 μm, powder comprising TiC-WC solid solution with an average grain diameter of 2 μm, powder of TaC with an average grain diameter of 1 μm and powder of Co with an average grain diameter of 1 μm were mixed together in such a manner that the resulting mixture contains 5% by weight of carbide of Ti and Ta, 5% by weight of Co and the balance of WC [5 wt % (Ti, Ta)C-5 wt % Co-bal. WC], then formed and fired in a vacuum at a temperature of 1450° C. for one hour and the obtained sintered body was processed to an insert (tip) to meet SPGN 120308 of ISO standard and used as a carbide base material. On this carbide base material, electrolytic etching was performed using a solution of KCl as an electrolytic solution under conditions shown in Table 1. As precipitates (coprecipitated substances of cobalt hydroxide and other electrolytic products [$WO_3$]) were formed during the electrolytic etching treatment, heavy metals were recovered by filtration of said coprecipitated substances left in the electrolytic solution after completion of the etching treatment. Because the resulting waste liquid was neutral, its treatment was much easier as compared with the etching treatment using acid or alkali. Since products formed due to an electrolytic reaction adhered on the surface of the base material after the etching treatment, the base material was washed with a 10% solution of NaOH to remove products and then it was immersed in acetone in which 1% by weight of diamond grains with an average grain diameter of 10 μm were dispersed, and thereafter flawing treatment on the surface of the base material was performed by ultrasonic cleaning.

These base materials on which the bumps and dips were formed were inserted into plasma CVD equipment which used 2.45GHz microwaves and synthesis conditions were consecutively changed between following two stages to produce cutting inserts (tips) (samples 1–4) with diamond coats of about 20 μm in thickness.

Development of diamond coats at first stage
Gas used: 5% by volume of CO-95% by volume of $H_2$
Gas flow: 100 cc/min.
Reaction chamber pressure: 40 Torr (5.3 kPa)
Temperature of base material: 900° C.
Synthesis time: 3 hours
Growing stage after development of diamond coats
Gas used: 15% by volume of CO-85% by volume of $H_2$
Gas flow: 100 cc/min.
Reaction chamber pressure: 40 Torr (5.3 kPa)
Temperature of base material: 900° C.
Synthesis time: 7 hours An intermittent cutting test performed on the cutting inserts with diamond coats under following test conditions, has showed that, in the cutting inserts with diamond coats of the present invention, diamond coats are neither broken away nor peeled off and the time that can be used for machining materials to be cut was significantly long, thus providing an excellent cutting performance.

Cutting test: Intermittent cutting by a milling cutter
(Machining on the surface of square plate shaped work piece of about 50 mm in thickness and about 150×150 mm in area.)
Work piece: Alloy of Al and 18% by weight of Si
cutting speed: 600 m/min.
Feed: 0.1 mm/tooth
Depth of cut: 0.5 mm
Samples 5–7 (Comparative Examples)

Using the same carbide base material as used in sample 1 on which electrolytic etching using a solution of KCl as an electrolytic solution was performed under conditions shown in Table 1, cutting inserts with diamond coats of about 20 μm in thickness (Samples 5–7) were manufactured by the same treatment and under the same vapor deposition condition as applied in Sample 1.

When an intermittent machining was performed on cutting in Samples 5 and 6 out of those manufactured in the same manner as in Sample 1, the diamond coats were peeled off after a short time of period of cutting due to insufficient formation of bumps and dips on the surface of the base material and a low adhesive strength between the coat and base material. Also, in Sample 7, because the shape of the cutting edge was not sharp and therefore resistance against cutting was large, the coat was peeled off after a short period of cutting and a large surface roughness of the work piece was observed.

Samples 8 and 9 (Examples of the present invention)

Powder of WC with an average grain diameter of 2 μm, powder comprising both TiC-WC solid solution with an average grain diameter of 2 μm, powder of TaC with an average grain diameter of 1 μm and powder of Co with an average grain diameter of 1 μm were mixed together in such a manner that the resulting mixture contains 4% in total by weight of carbide of Ta and Nb, 6% by weight of Co and the balance being WC [4 wt % (Ta, Nb)C-6 wt % Co-bal.WC], then formed and fired in a vacuum at a temperature of 1450° C. for one hour and the obtained sintered bodies were machined to inserts to meet SPGN 120308 of ISO standard resulting in a carbide base material. On this obtained carbide base material, electrolytic etching was performed using a solution of NaCl as an electrolytic solution under the conditions shown in Table 1. As precipitates (coprecipitated substances of cobalt hydroxide and other electrolytic products [$WO_3$]) and the like of electrolytic products were formed during the treatment of the electrolytic etching, heavy metals were recovered by filtration of said coprecipitated substances left in the electrolytic solution after completion of the etching treatment. Because the resulting waste liquid was neutral, its treatment was much easier as compared with the etching treatment using acids or alkali as an electrolytic solution. Since products formed due to an electrolytic reaction adhered on the surface of the base material after the etching treatment, the base material was washed with a 10% solution of NaOH to remove adhered products in the same manner as in Example 1. Then it was immersed in acetone in which 1% by weight of diamond grains with an average grain diameter of 10 μm were dispersed and, after ultrasonic washing, a flawing treatment on the surface of the base material was performed. Diamond coats of about 20 μm in thickness were developed on the obtained base materials in the same manner as in Sample 1 to produce cutting inserts (Samples 8 and 9) with diamond coats. The same cutting test as in Sample 1 was conducted on the obtained inserts and results shown in Table 1 were obtained. That is, the cutting inserts with diamond coats of the present invention provide an excellent intermittent cutting performance.

[Refer to Table 1.]

Samples 10 and 11 (Examples for comparison)

On the same insert base material as used in Sample 5 with the shape that meets SPGN120308 of ISO standard, electrolytic etching using diluted hydrochloric acid as an electrolytic solution under conditions shown in Table 1 was performed. The electrolytic solution after the etching is acid and also free from a precipitate and transparent. When this solution was made alkaline by adding a solution of NaOH, a brown precipitate including cobalt hydroxide etc. was formed. After filtration of this precipitate, the waste liquid was treated by neutralizing with diluted hydrochloric acid. Because the treatment of the waste liquid required this neutralization process, it was complicated. The base material that had undergone the electrolytic etching was washed in a 10% solution of NaOH to remove electrolytic products formed on the surface of the base material, and then following ultrasonic washing, a flawing treatment was performed and inserts with diamond coats of about 20 μm in thickness (Samples 10 and 11) were manufactured by using a microwave plasma CVD equipment under the same conditions as in Sample 1. A cutting test was conducted on the obtained cutting inserts in the same manner as in Sample 1 and results shown in Table 1 were obtained.

Sample 12 (Example of the present invention)

By using the insert base material, having the same composition as the carbide base material used in Sample 1 and also a sharp edge that meets SFGN120308 of ISO standard, on which electrolytic etching was performed using a solution of KCl as an electrolytic solution under conditions shown in Table 2, a cutting insert (Sample 12) with a diamond coat with a thickness of about 20 μm was manufactured by the same treatment and under the same conditions for vapor deposition as in Sample 1.

Samples 13–15 (Comparative Examples)

By using the insert base material, having the same composition as the carbide base material used in Sample 1 and also a sharp edge that meets SFGN120308 of ISO standard, on which electrolytic etching was performed using a solution of HCl as an electrolytic solution under conditions shown in Table 2, a cutting insert (samples 13–15) with a diamond coat with a thickness of about 20 μm was manufactured by the same treatment and under the same conditions for vapor deposition as in Sample 1.

An intermittent cutting test conducted on cutting inserts manufactured in Samples 12–15 shows that the insert manufactured in Sample 12 can machine work piece for a long time without peeling off diamond coats and provides an excellent cutting performance. On the other hand, chipping on the cutting edge occurred in the inserts manufactured in Samples 13 and 14 within a short time of period due to shock by cutting. Observation of this cutting edge by SEM (scanning electron microscope) shows that a layer where Co had eluted suffered chipping, as if it was scraped, and that the strength of the base material was lowered. The inserts manufactured in Sample 15 did not provide a sufficient surface roughness for adhesion and the diamond coats were peeled off before a cutting test was conducted.

[Refer to Table 2.]

In Tables 1 to 2, besides the conditions for electrolytic etching, surface roughness of the carbide base material that had undergone electrolytic etching, cutting time during which cutting was possible and cutting edge R (radius of a cutting edge) in each sample, respectively. Moreover, Table 2 shows depth of the layer of a carbide base material where Co eluted (Co-eluted layer).

Example 2

Figure 1:
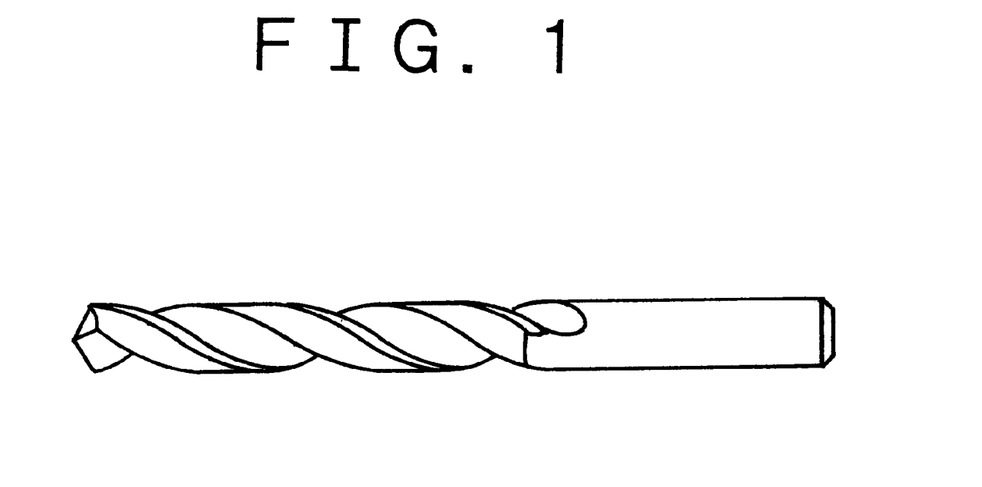
FIG. 1 illustrates a diamond coating drill on which a diamond coat is applied, which is seen from a direction normal to a rotary axis, in Example 2.

After electrolytic etching was performed on a straight drill (with a diameter of 1.00 mm) containing 1% in total by weight of carbide of Ta, Nb and V, 9% by weight of Co and the balance being WC [1 wt % (Ta, Nb, V)C-9 wt % Co-bal.WC] under conditions shown in Samples 16–19 in Table 3, electrolytic products adhered to the surface of the base material was removed by a 10% solution of NaOH. Because a solution of KCl as an electrolytic solution was used, only from a superficial part of the surface of the base material suffered elution and removal of Co, and therefore the removal of Co using acids was not required. The base material was immersed in a solvent in which diamond grains with an average grain diameter of 10 μm were dispersed and, after a ultrasonic flawing treatment, placed in plasma CVD equipment which used microwave of 2.45 GHz wherein coating of diamond of about 5 μm in thickness was applied under conditions shown below to produce a diamond coating drill. FIG. 1 illustrates the drill seen from a normal direction to its rotary axis. The diamond coat is developed throughout the entire surface up to a place being about 1.0 mm from the edge.

Gas used: 15% by volume of CO-85% by volume of $H_2$
Gas flow: 100 cc/min.
Reaction chamber pressure: 40 Torr (5.3 kPa)
Temperature of base material: 900° C.
Synthesis time: 5 hours A cutting test was conducted on these drills under conditions shown below to evaluate their adhesion. Evaluation was made by a drilling test wherein the number of drilling processes done before internal surface roughness within a bore reaches 30 μm which defines the tool life is measured and a worn state of the cutting edge and the presence of burrs were observed. Table 3 shows results. The results show that, in the diamond coating drill of the present invention, due to a high adhesion, no peeling off of diamond coats causable by cutting occurs and also due to no changes in the shape that may be caused by treatment to form the bumps and dips on the surface, the edge is sharp and furthermore there is no occurrence of burrs, providing excellent cutting results.

Work piece: Print board of 3.92 mm in thickness, wherein three glass epoxy resin plates with both faces plated with Cu (of 0.6 mm in thickness) are piled together and interposed between an Al plate (of 0.12 mm in thickness) and bakelite plate (of 2.0 mm in thickness).
Rotation speed: 80,000 rpm
Cutting speed: 1.6 m/min.

[Refer to Table 3.]

Comparative Example 2

Electrolytic etching was performed on the same straight drill as in Example 2 using a solution of KCl as an electrolytic solution under conditions shown in Samples 20 and 21 of Table 4, and coating of diamond of about 5 μm in thickness was applied to the above drill by the same treatment and diamond synthesis conditions as employed in Example 2 to produce a diamond coating drill. A cutting test conducted under the same conditions as in Example 2 shows that, due to low adhesion of diamond coats caused by insufficient bumps and dips on the surface, diamond coats were peeled off in a short time of period of cutting. Also, in the drill prepared in Sample 21, burrs caused by a blunt cutting edge were observed.

[Refer to Table 4.]

Example 3

Electrolytic etching was performed on a straight drill (with a diameter of 1.00 mm) containing 1.2% in total by weight of carbide of Ta, Nb and V, 5.8% by weight of Co and the balance being WC [1.2 wt % (Ta, Nb, V)C-5.8 wt % Co-bal.WC] using a solution of NaCl as an electrolytic solution under conditions shown in Samples 22 and 23 in Table 5. Because electrolytic products adhered to the surface of the base material which had undergone etching, removal using 10% solution of NaOH was performed. In addition, because Co that existed on a superficial part of the surface of the base material was eluted during the electrolytic etching treatment, Co removal treatment was not performed. The drill was soaked in a solvent in which diamond grains with an average grain diameter of 10 μm were dispersed and ultrasonic flawing treatment was conducted. Coating of diamond of about 5 μm in thickness was applied to the above drill by the same treatment and diamond synthesis conditions as employed in Example 2 to produce a diamond coating drill. A cutting test conducted under the same conditions as in Example 2 shows that the drill provided an excellent cutting performance.

[Refer to Table 5.]

Comparative Example 3

Electrolytic etching was performed on the same straight drill as used in Example 2, using a solution of HCl as an electrolytic solution under conditions shown in Samples 24 and 25 and, after the completion of washing of electrolytic products and flawing treatment, coating of diamond of about 5 μm in thickness was applied to the above drill under the same synthesis conditions as in Example 2 to produce a diamond coating drill. A cutting test conducted on the drill in Sample 24 under the same conditions as in Example 2 shows that the drill became chipped in a short time of period of cutting. This is because a bond phase Co eluted from the surface of the base material during the electrolytic etching treatment as the electrolytic solution was acid and, as a result, the strength of the base material itself was lowered. In Sample 25, due to excessive elution of Co during the electrolytic etching, the cutting edge cracked and became chipped and the diamond coating was impossible.

[Refer to Table 6.]

Comparative Example 4

Electrolytic etching was performed on the same straight drill as used in Example 3, using a solution of NaOH as an electrolytic solution under the conditions shown in Samples 26 and 27 in Table 7. Because of no electrolytic products formed, removal treatment was not required accordingly.

However, because Co was exposed on the surface of the base material that had undergone the etching treatment, the base material was soaked in an aqueous solution of 10% HCl and 3% $H_2O_2$ for 30 seconds to remove Co from the surface of the base material. Then, coating of diamond of about 5 μm in thickness was applied to the above drill under the same synthesis conditions as in Example 2 to produce a diamond coating drill and a cutting test conducted on the drill in Example 2 under the same conditions as in Example 2. As a result, due to low adhesion of the drill to diamond coats caused by insufficient bumps and dips, diamond coats were peeled off in a short time of period of cutting.

[Refre to Table 7.]

Figure 2:
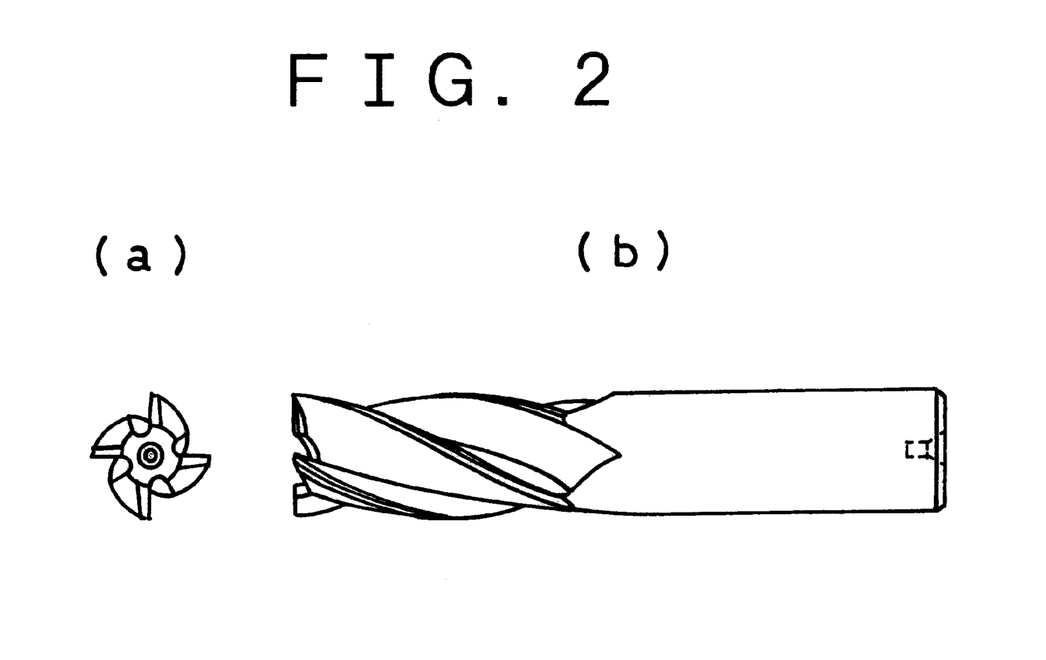
Figure 3:
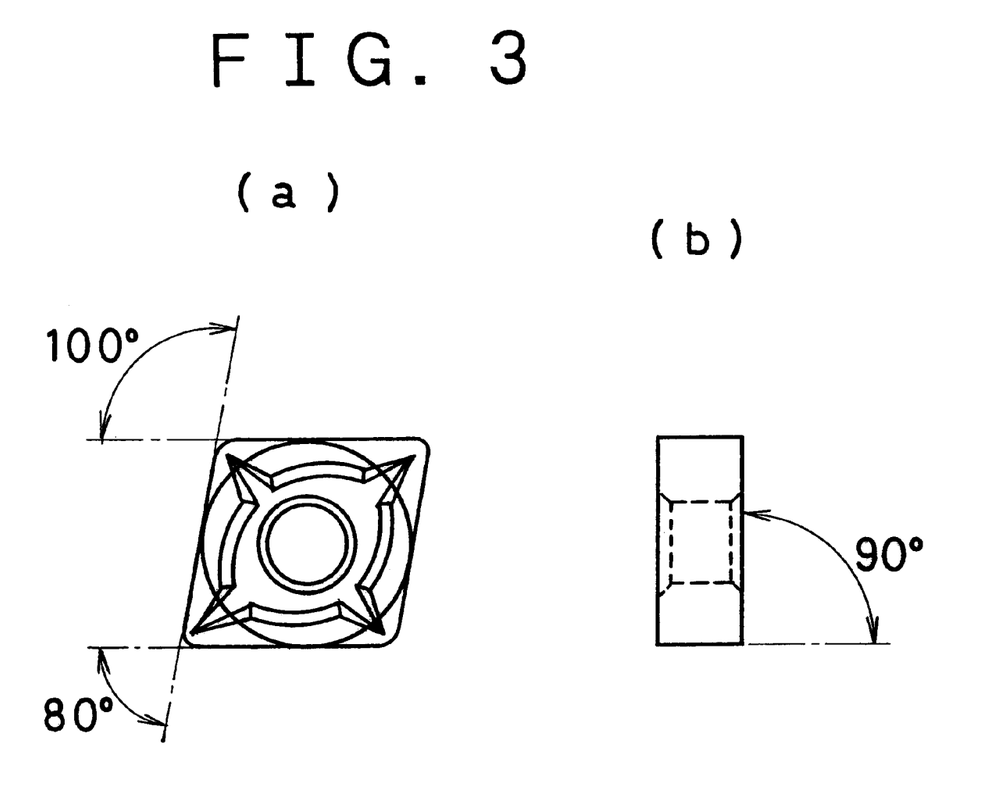

The superhard article manufactured by the method of the present invention is preferably applicable to not only such straight drills as shown in said Examples 2 to 3 but also a carbide base material with a complicated shape such a carbide tool as an end mill or a throwing away insert (tip) having chips breakers (grooves formed around the edge on the surface of an insert). One example of such an end mill is shown in FIG. 2 and one example of a throwing away insert having chip breakers is shown in FIG. 3.

FIG. 2(a) illustrates an end mill seen from its rotary axis direction and FIG. 2(b) illustrates an end mill seen from a direction normal to the rotary axis. FIG. 3(a) is a view of a throwing away insert seen from the axis direction of its through-hole with a circular cylindrical shape. FIG. 3(b) is a view of a throwing away insert seen from a direction normal to its axis of the through-hole with a circular cylindrical shape.

As many apparently widely different embodiments of the present invention can be made without departing from the spirit and scope thereof, it is to be understood that the invention is not limited to the specific embodiments thereof except as defined in the appended claims.

Documents describing chemical formula, specifications

TABLE 1

| Sample | Alkali chloride concentration (wt %) | | Treatement time (min) | Current density (A/cm$^2$) | Maximum removal speed (μm/min) | Surface roughness (μm) | Cutting time (min) | Cutting edge R (μm) |
| --- | --- | --- | --- | --- | --- | --- | --- | --- |
| 1 | KCl | 5 | 15 | 0.15 | 0.65 | 1.0 | >60 | <5 |
| 2 | KCl | 1 | 20 | 0.15 | 0.55 | 0.9 | >60 | 10 |
| 3 | KCl | 10 | 10 | 0.15 | 0.80 | 0.8 | >55 | 20 |
| 4 | KCl | 5 | 5 | 0.25 | 1.40 | 0.8 | >55 | 20 |
| 5 | KCl | 0.5 | 30 | 0.30 | 0.15 | 0.3 | <20 | <5 |
| 6 | KCl | 15 | 15 | 0.15 | 1.60 | 0.5 | <30 | 35 |
| 7 | KCl | 5 | 3 | 0.50 | 2.00 | 0.6 | <20 | 20 |
| 8 | NaCl | 5 | 15 | 0.15 | 0.50 | 0.7 | >50 | 10 |
| 9 | NaCl | 5 | 20 | 0.15 | 0.55 | 0.7 | >50 | 15 |
| 10 | HCl | 5 | 15 | 0.15 | 0.40 | 0.6 | >45 | <5 |
| 11 | HCl | 10 | 15 | 0.15 | 0.45 | 0.65 | >45 | 10 |

TABLE 2

| Sample | Alkali chloride concentration (wt %) | | Treatment time (min) | Current density (A/cm$^2$) | Maximum removal speed (μm/min) | Surface roughness (μm) | Cutting time (min) | Cutting edge R (μm) | Co eluted layer (μm) |
| --- | --- | --- | --- | --- | --- | --- | --- | --- | --- |
| 12 | KCl | 5 | 15 | 0.15 | 0.65 | 1.0 | >60 | <5 | 2 |
| 13 | HCl | 10 | 25 | 0.15 | 0.45 | 1.0 | <5 | 8 | 15 |
| 14 | HCl | 10 | 15 | 0.15 | 0.45 | 0.7 | <15 | 7 | 10 |
| 15 | HCl | 5 | 5 | 0.15 | 0.40 | 0.12 | Peeled off | (5 | 2 |

TABLE 3

[Example 2]

| Sample | KCl concentration (%) | Treatment time (min) | Current density (A/cm²) | Maximum removal speed (μm/min) | Cutting edge worn state | Occurrence of burrs | Numbers of drilling | Remarks |
|---|---|---|---|---|---|---|---|---|
| 16 | 5 | 15 | 0.08 | 0.20 | Normal wear | None | 100,213 | |
| 17 | 4 | 17 | 0.08 | 0.18 | Normal wear | None | 97,260 | |
| 18 | 6 | 10 | 0.08 | 0.21 | Normal wear | None | 98,450 | |
| 19 | 4 | 13 | 0.10 | 0.23 | Normal wear | None | 99,011 | |

TABLE 4

[Comparative Example 2]

| Sample | KCl concentration (%) | Treatment time (min) | Current density (A/cm²) | Maximum removal speed (μm/min) | Cutting edge worn state | Occurrence of burrs | Numbers of drilling | Remarks |
|---|---|---|---|---|---|---|---|---|
| 20 | 0.3 | 20 | 0.10 | 0.09 | Peeled off | None | 1,925 | Small bumps and dips |
| 21 | 5 | 5 | 0.23 | 0.78 | Peeled off | Observed | 4,332 | Small bumps and dips, blunted edge |

TABLE 5

[Example 3]

| Sample | NaCl concentration (%) | Treatment time (min) | Current density (A/cm²) | Maximum removal speed (μm/min) | Cutting edge worn state | Occurrence of burrs | Numbers of drilling | Remarks |
|---|---|---|---|---|---|---|---|---|
| 22 | 5 | 15 | 0.08 | 0.18 | Normal wear | None | 89,774 | |
| 23 | 6 | 15 | 0.08 | 0.19 | Normal wear | None | 91,159 | |

TABLE 6

[Comparative Example 3]

| Sample | HCl concentration (%) | Treatment time (min) | Current density (A/cm²) | Maximum removal speed (μm/min) | Cutting edge abrasion state | Occurrence of burrs | Numbers of drilling | Remarks |
|---|---|---|---|---|---|---|---|---|
| 24 | 5 | 15 | 0.08 | 0.16 | Chipping | Observed | 48,884 | Reduction in strength of base material due to Co elution |
| 25 | 10 | 15 | 0.08 | 0.20 | — | — | — | Chipping of cutting edge during treatment |

TABLE 7

[Comparative Example 4]

| Sample | NaOH concentration (%) | Treatment time (min) | Current density (A/cm²) | Maximum removal speed (μm/min) | Cutting edge worn state | Occurrence of burrs | Numbers of drilling | Remarks |
|---|---|---|---|---|---|---|---|---|
| 26 | 5 | 15 | 0.10 | 0.02 | Peeled off | Observed | 992 | Small bumps and dips |
| 27 | 10 | 15 | 0.08 | 0.02 | Peeled off | Observed | 1,324 | Small bumps and dips |

What is claimed is:

1. A method of manufacturing a superhard article with a diamond coat, comprising:

placing a carbide base material formed to a desired shape and comprising tungsten carbide (WC) as a main component in a solution of alkali chloride, electrolytically etching the surface of the carbide base material in said solution of alkali chloride at a maximum speed of progress of an etching front through the carbide base material of 0.2 to 1.5 µm/min for 3 to 30 minutes, washing the surface of the etched carbide base material, and thereafter forming the diamond coat on the surface of the washed carbide base material by a vapor deposition technique.

2. The method as defined in claim 1 wherein the carbide base material comprises 0.5 to 10% in total by weight, calculated in carbide equivalent, of one or more selected from carbide, nitride and carbon nitride of Ti, Ta, and Nb and also 2 to 10% in total by weight of Co and/or Ni.

3. The method as defined in claim 1 wherein the solution of alkali chloride has a concentration of 0.5 to 20% in weight, and the electrolytic etching is carried out at a current density of the surface of the carbide base material of 0.1 to 0.3 A/cm$^2$.

4. The method as defined in claim 1 wherein the solution of alkali chloride is a solution of potassium chloride or sodium chloride.

5. The method as defined in claim 1 wherein the diamond coat is developed by vapor deposition technique on the surface of the base material at a rate of 0.1 to 1.0 µm/hour during 15 to 50% of an initial period of time and at a rate of 1.0 to 2.0 µm/hour during the remaining period of time.

6. The method as defined in claim 1 wherein after electrolytic etching the carbide base material is soaked in a solvent in which diamond grains are dispersed, and ultrasonic treatment is made.

7. The method as defined in claim 1 wherein the base material has a rounded profile line on cross-section of the angle region with a radius of curvature R of 30 µm or less.

8. A method of manufacturing a superhard article with a diamond coat as defined in claim 1, wherein the carbide base material has a surface roughness Ra of 0.7 to 1.5 µm measured in accordance with Japanese Industry Standard (JIS) B0601 (1994).

9. A method of manufacturing a superhard article with a diamond coat as defined in claim 1, wherein the carbide base material has a surface roughness Ra of 0.4 to 1.5 µm measured in accordance with Japanese Industry Standard (JIS) B0601 (1994).

10. The method as defined in claim 1, 8 or 9 wherein the carbide base material contains 0.3 to 10% in total by weight, calculated in carbide equivalent, of one or more selected from carbide, nitride and carbon nitride of Ti, Ta, Nb and V and 2 to 10% in total by weight of Co and/or Ni.

11. The method as defined in claim 1, 2, 4 or 9 wherein the concentration of the solution of alkali chloride is 0.5 to 20% in weight, and the electrolytic etching is carried out at a current density of the surface of the base material of 0.03 to 0.3 A/cm$^2$.

12. The method of claim 1, wherein the alkali chloride solution is a KCl solution.

13. The method of claim 12, wherein a concentration of KCl in the KCl solution is 0.5–20 wt %.

14. The method of claim 12, wherein a concentration of KCl in the KCl solution is 1–10 wt %.

15. A superhard article with a diamond coat made according to the method as defined in claim 1, 8 or 9, wherein the superhard article is a cutting tool.

16. A method of manufacturing a superhard article with a diamond coat, comprising:

placing a carbide base material formed to a desired shape and comprising tungsten carbide (WC) as a main component in a solution of KCl, electrolytically etching the surface of the carbide base material in said solution of KCl at a maximum speed of progress of an etching front through the carbide base material of 0.2 to 1.5 µm/min for 3 to 30 minutes under a current density of 0.03–0.3 A/cm$^2$ at a surface of the carbide base material, washing the surface of the etched carbide base material, and thereafter forming the diamond coat on the surface of the washed carbide base material by a vapor deposition technique.

17. The method of claim 16, wherein a concentration of KCl in the solution of KCl is 0.5–20 wt %.

18. The method of claim 16, wherein a concentration of KCl in the solution of KCl is 0.5–20 wt % and the current density is 0.1–0.3 A/cm$^2$.

19. The method of claim 16, wherein a concentration of KCl in the solution of KCl is 1–10 wt % and the current density is 0.06–0.25 A/cm$^2$.

20. The method of claim 16, wherein the concentration of KCl in the solution of KCl is 1–10 wt % and the current density is 0.15–0.25 A/cm$^2$.

* * * * *